United States Patent
Pal

(10) Patent No.: US 8,300,412 B2
(45) Date of Patent: Oct. 30, 2012

(54) HEAT EXCHANGER FOR MOTOR CONTROLLER

(75) Inventor: Debabrata Pal, Hoffman Estates, IL (US)

(73) Assignee: Hamilton Sundstrand Corporation, Windsor Locks, CT (US)

( * ) Notice: Subject to any disclaimer, the term of this patent is extended or adjusted under 35 U.S.C. 154(b) by 216 days.

(21) Appl. No.: 12/895,157

(22) Filed: Sep. 30, 2010

(65) Prior Publication Data
US 2012/0080165 A1 Apr. 5, 2012

(51) Int. Cl.
*H05K 7/20* (2006.01)
(52) U.S. Cl. ........ 361/699; 361/688; 361/689; 361/690; 361/695; 165/80.3; 165/80.4
(58) Field of Classification Search ................... None
See application file for complete search history.

(56) References Cited

U.S. PATENT DOCUMENTS

| | | | |
|---|---|---|---|
| 4,474,001 A | 10/1984 | Griffin et al. | |
| 5,963,425 A | 10/1999 | Chrysler et al. | |
| 6,034,872 A | 3/2000 | Chrysler et al. | |
| 6,167,621 B1 | 1/2001 | Goth et al. | |
| 6,182,435 B1 | 2/2001 | Niggemann et al. | |
| 6,305,463 B1 | 10/2001 | Salmonson | |
| 6,939,392 B2 | 9/2005 | Huang et al. | |
| 7,231,769 B2 | 6/2007 | Spadaccini et al. | |
| 7,325,519 B2 | 2/2008 | Sugimoto et al. | |
| 7,401,598 B2 | 7/2008 | Ochiai | |
| 7,579,805 B2 * | 8/2009 | Saito et al. ................ | 318/800 |
| 7,660,122 B2 * | 2/2010 | Nakamura et al. ........ | 361/699 |
| 7,661,460 B1 | 2/2010 | Cowans et al. | |
| 7,757,506 B2 | 7/2010 | Ellsworth, Jr. et al. | |
| 7,787,248 B2 | 8/2010 | Campbell et al. | |
| 7,876,563 B2 * | 1/2011 | Shiba .................... | 361/699 |
| 8,174,833 B2 * | 5/2012 | Kitanaka et al. ......... | 361/710 |
| 2005/0128706 A1 * | 6/2005 | Maly et al. .............. | 361/699 |
| 2007/0264133 A1 | 11/2007 | Schwarz et al. | |
| 2008/0053101 A1 | 3/2008 | Schwarz | |
| 2008/0090510 A1 | 4/2008 | Scherer et al. | |
| 2008/0110596 A1 | 5/2008 | Schwarz et al. | |
| 2008/0121376 A1 | 5/2008 | Schwarz et al. | |

(Continued)

FOREIGN PATENT DOCUMENTS
WO   2007065666 A2   6/2007

OTHER PUBLICATIONS

Combined Search and Examination Report; GB Application No. GB1119974.2; Date if Mailing: Mar. 20, 2012; 5 pages.

*Primary Examiner* — Boris Chervinsky
(74) *Attorney, Agent, or Firm* — Cantor Colburn LLP

(57) ABSTRACT

A heat exchanger apparatus is provided and includes a motor controller housing, supportively disposed with a turbofan within an aircraft engine nacelle, in which motor controller components are mounted, a fuel cooled cold plate, forming a surface of the housing, which forms a heat transfer path by which motor controller component generated heat is dissipated during first conditions and an air cooled cold plate, disposed in thermal communication with the fuel cooled cold plate, which extends into a flow path of nacelle air generated by the turbofan to form an extended heat transfer path by which the motor controller component generated heat is dissipated during second conditions.

20 Claims, 4 Drawing Sheets

U.S. PATENT DOCUMENTS

| | | |
|---|---|---|
| 2008/0314573 A1 | 12/2008 | Schwarz et al. |
| 2009/0147479 A1* | 6/2009 | Mori et al. .................... 361/699 |
| 2010/0024438 A1 | 2/2010 | Hoffjann et al. |
| 2010/0027220 A1* | 2/2010 | Hughes et al. ................ 361/702 |
| 2010/0170262 A1 | 7/2010 | Kaslusky et al. |
| 2010/0242492 A1* | 9/2010 | Sloat et al. ...................... 60/793 |
| 2010/0309630 A1* | 12/2010 | Jones et al. .................... 361/694 |
| 2011/0192568 A1 | 8/2011 | Hsieh et al. |

* cited by examiner

HEAT EXCHANGER FOR MOTOR CONTROLLER

BACKGROUND OF THE INVENTION

The subject matter disclosed herein relates to a heat exchanger for a motor controller and, more particularly, to an integrated dual coolant heat exchanger for a motor controller of an aircraft engine.

In modern aircraft engines, electrical power is generated by generators, which are driven by aircraft engines. Often, these generators are also used as electric starters to start engines. Motor controllers are used to control the starters and generator functions of these generators. Such motor controllers are often supportively disposed within the aircraft engine nacelle.

Generally, the motor controller includes various electrical components and sub-assemblies used for controlling generators, which generate electrical energy from the mechanical energy of the aircraft engine. The components and sub-assemblies include, for example, printed wiring boards, inductors and inverter modules, each of which generates varying amounts of heat that needs to be dissipated in order for the motor controller to operate properly. This is normally accomplished by flowing fuel through a heat exchanger associated with the motor controller during ground operations. However, since the fuel flow to the heat exchanger is prevented during in-flight operations, the degree of heat exchange is limited.

BRIEF DESCRIPTION OF THE INVENTION

According to one aspect of the invention, a heat exchanger apparatus is provided and includes a motor controller housing, supportively disposed with a turbofan within an aircraft engine nacelle, in which motor controller components are mounted, a fuel cooled cold plate, forming a surface of the housing, which forms a heat transfer path by which motor controller component generated heat is dissipated during first conditions and an air cooled cold plate, disposed in thermal communication with the fuel cooled cold plate, which extends into a flow path of nacelle air generated by the turbofan to form an extended heat transfer path by which the motor controller component generated heat is dissipated during second conditions.

According to another aspect of the invention, a heat exchanger apparatus for a motor controller, which is supportively disposed with a turbofan within an aircraft engine nacelle is provided and includes a fuel cooled cold plate including a top plate, a bottom plate and a plurality of first fins interposed between and disposed in thermal communication with the top and bottom plates, the top plate having motor controller components mounted thereto and the bottom plate being disposed proximate to the turbofan and an air cooled cold plate disposed in thermal communication with the bottom plate and including second fins extending into a flow path of nacelle air generated by the turbofan.

According to yet another aspect of the invention, a heat exchanger apparatus for an aircraft engine nacelle with a turbofan is provided and includes a motor controller housing in which motor controller components are mounted, a fuel cooled cold plate forming a surface of the housing and including a top plate, a bottom plate and a plurality of first fins interposed between and disposed in thermal communication with the top and bottom plates, the top plate having the motor controller components mounted thereto and the bottom plate being disposed for positioning proximate to the turbofan and an air cooled cold plate disposed in thermal communication with the bottom plate and including second fins extending to receive nacelle air in a flow path generated by the turbofan.

These and other advantages and features will become more apparent from the following description taken in conjunction with the drawings.

BRIEF DESCRIPTION OF THE DRAWING

The subject matter which is regarded as the invention is particularly pointed out and distinctly claimed in the claims at the conclusion of the specification. The foregoing and other features, and advantages of the invention are apparent from the following detailed description taken in conjunction with the accompanying drawings in which:

The detailed description explains embodiments of the invention, together with advantages and features, by way of example with reference to the drawings.

DETAILED DESCRIPTION OF THE INVENTION

In accordance with aspects of the invention, a fuel cooled motor controller located in an engine nacelle of an aircraft is cooled by fuel during ground operations and cooled by nacelle air during flight cruise operations. Heat dissipating components of the motor controller are in contact with a fuel cooled cold plate but, when fuel flow is turned off, heat conducts to an air cooled cold plate and, since the fuel and air cooled cold plates are each located in such respective manners and sized in such respective manners that the heat dissipating components can dissipate heat during both fuel and air cooling modes without exceeding their safe operating temperature limit.

Figure 1:
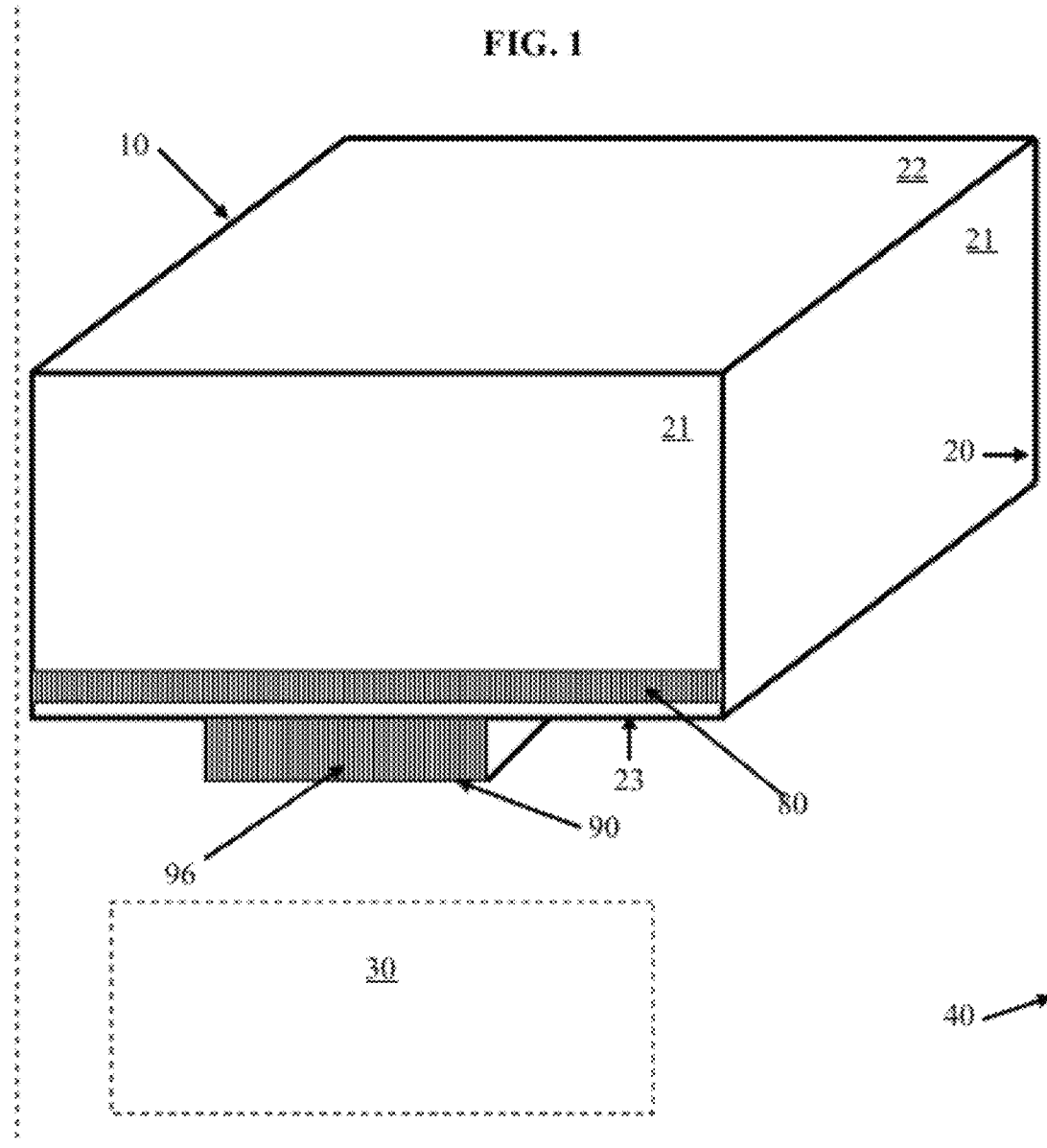
FIG. 1 is a perspective view of a motor controller.
Figure 2:
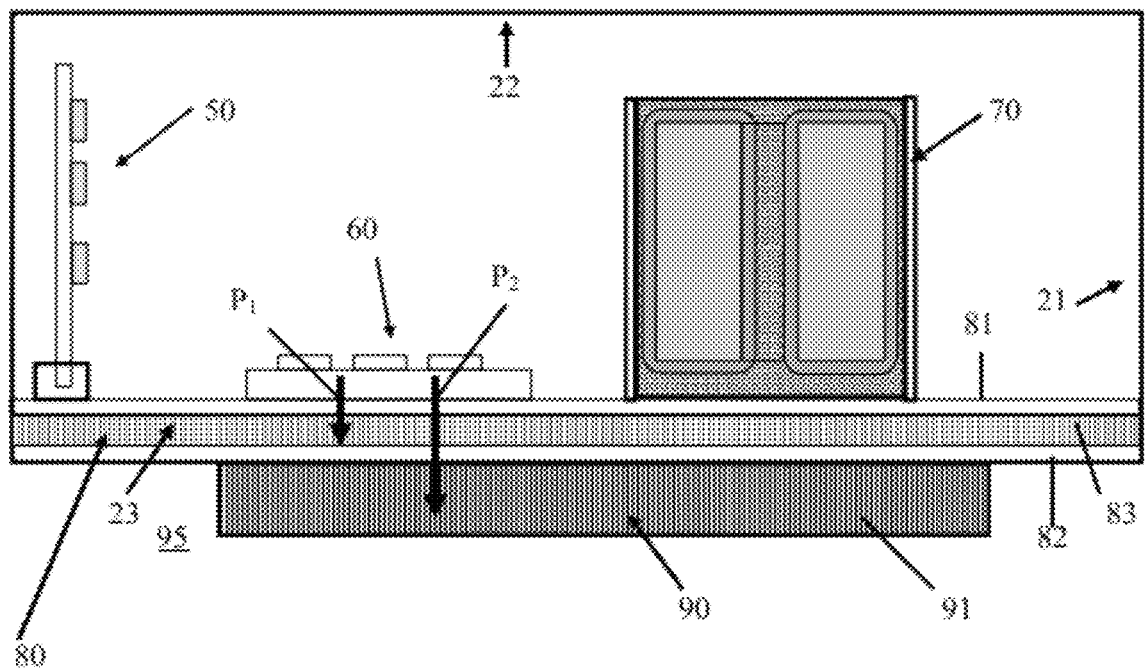
FIG. 2 is a plan view of the motor controller of FIG. 1.
Figure 3:
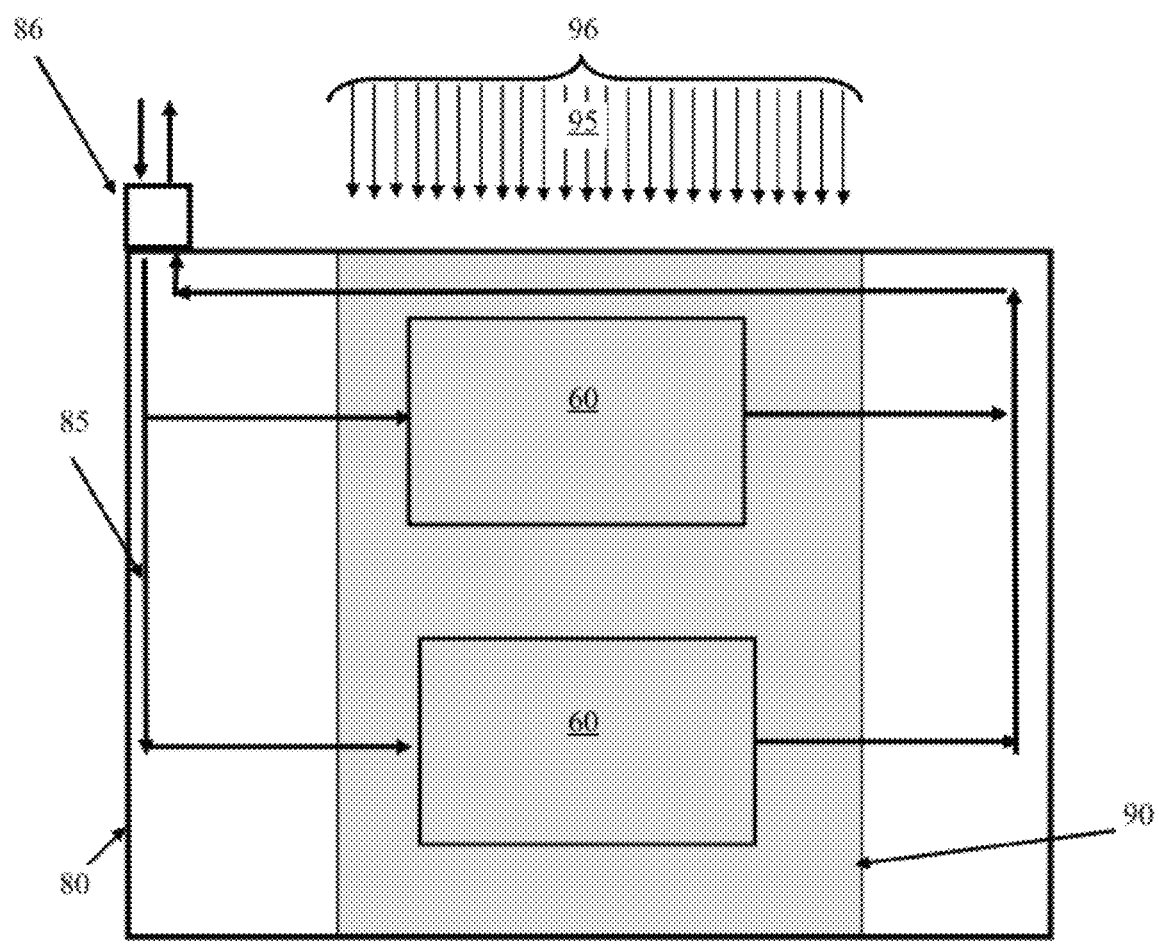
FIG. 3 is a schematic illustration of heat transfer features of the motor controller of FIG. 1.

With reference to FIGS. 1-3, a heat exchanger apparatus 10 is provided and includes a motor controller housing 20, which is supportively disposed along with a turbofan 30 within an aircraft engine nacelle 40. Motor controller components 50, 60, 70, such as a printed wiring board (PWB) 50, an inverter module 60 (i.e., an insulated gate bipolar transistor (IGBT)) and inductors 70, are mounted within the motor controller housing 20. The heat exchanger apparatus 10 further includes a fuel cooled cold plate 80 and an air cooled cold plate 90. As shown in FIG. 1, the motor controller housing 20 includes sidewalls 21 and upper and lower surfaces 22 and 23, respectively. The lower surface 23 is disposed for positioning proximate to the turbofan 30 and the upper surface 22 is remote from the turbofan 30 in a direction generally aligned with a longitudinal extension of the engine nacelle 40.

The fuel cooled cold plate 80 forms the lower surface 23 of the motor controller housing 20 and includes a top plate 81, a bottom plate 82 and a plurality of first fins 83. The top plate 81 and the bottom plate 82 are each substantially planar and substantially parallel with one another. The plurality of first fins 83 form a fin core of the fuel cooled cold plate 80 and are interposed between the top and bottom plates 81, 82 with each of the fins 83 being disposed in thermal communication with the top and bottom plates 81, 82. The motor controller components 50, 60, 70 are mounted to the top plate 81 and the bottom plate 82 is disposed proximate to the turbofan 30 such that an exemplary first heat transfer path, $P_1$, is formed from one or more of the motor controller components 50, 60, 70 and sequentially through the top plate 81, the fins 83 and the bottom plate 82.

As shown in FIG. 3, the fuel cooled cold plate 80 is further formed to define a fuel passage 85 therein. The fuel passage 85 is fluidly coupled to the valve 86 such that, when the valve 86, which may include a fuel flow inlet and outlet quick disconnect, is open, during for example ground operations, fuel is permitted to flow through the fuel cooled cold plate 80 whereby the fuel, which is generally provided at a low temperature, increases heat transfer from the motor controller components 50, 60 and 70. By contrast, when the valve 86 is closed, during for example in-flight operations, fuel is prevented from flowing through the fuel cooled cold plate 80.

The air cooled cold plate 90 is disposed in thermal communication with the bottom plate 82 of the fuel cooled cold plate 80. The air cooled cold plate 90 may be formed in a similar fashion as the fuel cooled cold plate 80 although this is not required except to the extent that the air cooled cold plate 90 should be sufficiently well supported for adaptability to conditions of in-flight operations. The air cooled cold plate 90 includes a plurality of second fins 91 that form a fin core of the air cooled cold plate 90. The plurality of second fins 91 are thermally communicative with the bottom plate 82 and extend to receive nacelle air 96 in flow path 95, which is generated by the operation of the turbofan 30. Thus, the air cooled cold plate 90 forms a second heat transfer path, $P_2$, which is generally longer than the first heat transfer path, $P_1$, along which heat can be dissipated from the motor controller components 50, 60, 70. In this way, even if the fuel flow to the fuel cooled cold plate 80 is prevented, heat dissipation remains possible along the second heat transfer path, $P_2$.

As shown in FIG. 2, the air cooled cold plate 90 has sufficient length such that the air cooled cold plate 90 extends from a first side of the inverter module 60 to the opposite side of the inductors 70. In this way, the motor controller components that generate the most heat to be dissipated (i.e., the inverter module 60 and the inductors 70) are the components positioned closest to the air cooled cold plate 90.

Figure 4:
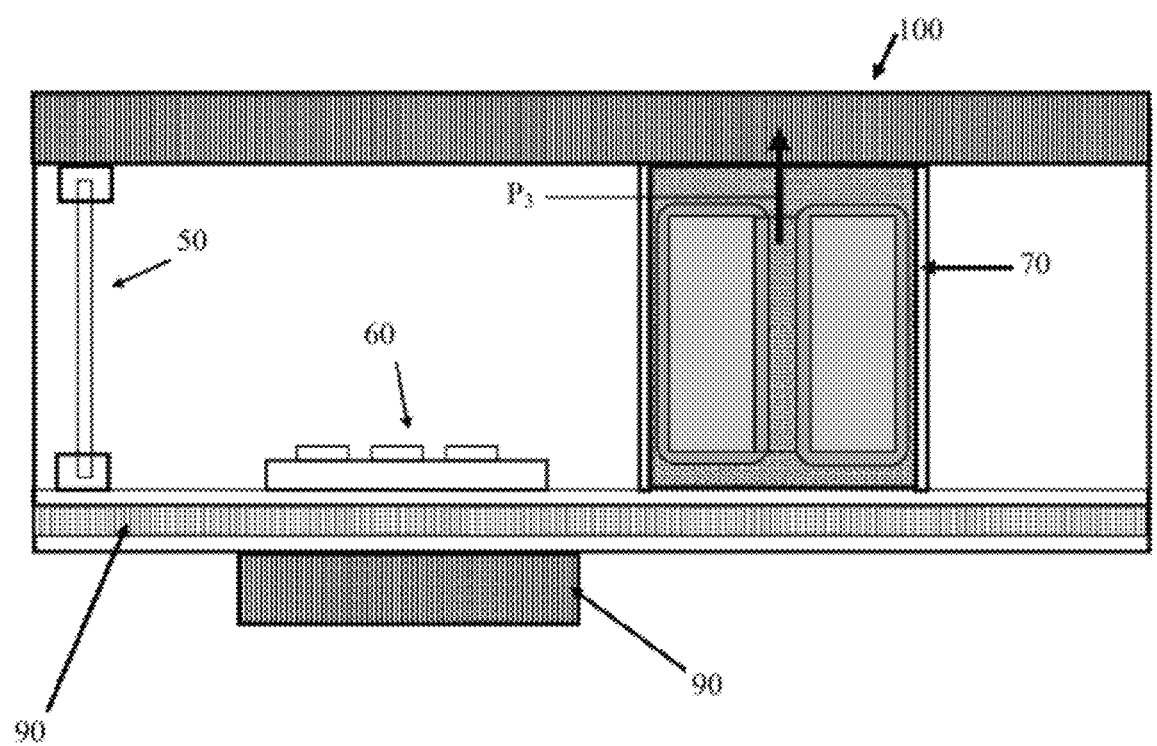
FIG. 4 is a plan view of the motor controller of FIG. 1 according to alternate embodiments.

In accordance with alternate embodiments and, with reference to FIG. 4, the air cooled cold plate 90 may be disposed locally with respect to, for example, the inverter module 60. In this case, the air cooled cold plate 90 is proximate to the motor controller component that generates the most heat to be dissipated (i.e., the inverter module 60) and is provided with a relatively short length, size and weight.

As additionally shown in FIG. 4, the heat exchanger apparatus 10 may further include a second air cooled cold plate 100. In this case, the second air cooled cold plate 100 may be disposed at an opposite side of the motor controller housing from the air cooled cold plate 90. As such, the second air cooled cold plate 100 forms a third heat transfer path, $P_3$, by which additional heat may be dissipated from various components housed within the motor controller housing 20. For example, at least the inductors 70 and possibly the PWB 50 may be disposed in thermal communication with the second air cooled cold plate 100 such that heat generated by at least the inductors 70 can be dissipated directly along the first and third heat transfer paths, $P_1$, $P_3$, and indirectly along the second heat transfer path, $P_2$.

In accordance with aspects of the invention, the densities and the physical/material properties of the first fins 83 and the second fins 91 are provided to facilitate dissipation of motor controller component generated heat during both ground operations and in-flight operations. As an example, for an airspeed of 128.6 m/s (250 knots), the fuel cooled cold plate 80 may include about 23 first fins per inch arranged in a lanced offset, scaled arrangement, with each first fin 83 having a height of about 0.125 inches (0.3 cm) and a thickness of about 0.006 inches (0.02 cm). Here, the air cooled cold plate may include about 30 second fins 91 per inch, with each second fin 91 having a height of about 0.5 inches (1.27 cm) and a thickness of about 0.01 inches (0.03 cm).

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

The invention claimed is:

1. A heat exchanger apparatus, comprising:
a motor controller housing, supportively disposed with a turbofan within an aircraft engine nacelle, in which motor controller components are mounted;
a fuel cooled cold plate, forming a surface of the housing, which forms a heat transfer path by which motor controller component generated heat is dissipated during first conditions; and
an air cooled cold plate, disposed in thermal communication with the fuel cooled cold plate, which extends into a flow path of nacelle air generated by the turbofan to form an extended heat transfer path by which the motor controller component generated heat is dissipated during second conditions.

2. The heat exchanger apparatus according to claim 1, wherein the motor controller components comprise an inverter module.

3. The heat exchanger apparatus according to claim 1, wherein the motor controller components comprise a printed wiring board, an inverter module and inductors.

4. The heat exchanger apparatus according to claim 1, wherein fuel flow to the fuel cooled cold plate is prevented in-flight.

5. A heat exchanger apparatus for a motor controller, which is supportively disposed with a turbofan within an aircraft engine nacelle, the heat exchanger apparatus comprising:
a fuel cooled cold plate including a top plate, a bottom plate and a plurality of first fins interposed between and disposed in thermal communication with the top and bottom plates, the top plate having motor controller components mounted thereto and the bottom plate being disposed proximate to the turbofan; and
an air cooled cold plate disposed in thermal communication with the bottom plate and including second fins extending into a flow path of nacelle air generated by the turbofan.

6. The heat exchanger apparatus according to claim 5, wherein the top and bottom plate are each planar and substantially parallel with one another.

7. The heat exchanger apparatus according to claim 5, further comprising a valve by which fuel flow to the fuel cooled cold plate is permitted or prevented, the valve being opened during ground operations and closed in-flight.

8. The heat exchanger apparatus according to claim 5, wherein the motor controller components comprise a printed wiring board, an inverter module and inductors.

9. The heat exchanger apparatus according to claim 8, wherein the air cooled cold plate extends from the inverter module to the inductors.

10. The heat exchanger apparatus according to claim 8, wherein the air cooled cold plate is locally disposed proximate to the inverter module.

11. The heat exchanger apparatus according to claim 8, further comprising a second air cooled cold plate disposed at an opposite side of the motor controller from the air cooled cold plate, wherein the inductors are disposed in thermal communication with at least the air cooled cold plate and the second air cooled cold plate.

12. A heat exchanger apparatus for an aircraft engine nacelle with a turbofan, comprising:
   a motor controller housing in which motor controller components are mounted;
   a fuel cooled cold plate forming a surface of the housing and including a top plate, a bottom plate and a plurality of first fins interposed between and disposed in thermal communication with the top and bottom plates, the top plate having the motor controller components mounted thereto and the bottom plate being disposed for positioning proximate to the turbofan; and
   an air cooled cold plate disposed in thermal communication with the bottom plate and including second fins extending to receive nacelle air in a flow path generated by the turbofan.

13. The heat exchanger apparatus according to claim 12, wherein the top and bottom plate are each planar and substantially parallel with one another.

14. The heat exchanger apparatus according to claim 12, further comprising a valve by which fuel flow to the fuel cooled cold plate is permitted or prevented.

15. The heat exchanger apparatus according to claim 14, wherein the valve is opened during ground operations and closed in-flight.

16. The heat exchanger apparatus according to claim 12, wherein the motor controller components comprise a printed wiring board, an inverter module and inductors.

17. The heat exchanger apparatus according to claim 16, wherein the air cooled cold plate extends from the inverter module to the inductors.

18. The heat exchanger apparatus according to claim 16, wherein the air cooled cold plate is locally disposed proximate to the inverter module.

19. The heat exchanger apparatus according to claim 16, further comprising a second air cooled cold plate disposed at an opposite side of the motor controller from the air cooled cold plate.

20. The heat exchanger apparatus according to claim 19, wherein the inductors are disposed in thermal communication with at least the air cooled cold plate and the second air cooled cold plate.

* * * * *